(12) United States Patent
Neeld et al.

(10) Patent No.: US 6,765,807 B1
(45) Date of Patent: Jul. 20, 2004

(54) ASSEMBLY AND METHOD FOR REDUCING ELECTROMAGNETIC INTERFERENCE GENERATED BY ELECTRONIC SYSTEMS

(75) Inventors: Kenneth J. Neeld, West Chester, PA (US); Terry W. Louth, Narvon, PA (US)

(73) Assignee: Unisys Corporation, Blue Bell, PA (US)

( * ) Notice: Subject to any disclaimer, the term of this patent is extended or adjusted under 35 U.S.C. 154(b) by 184 days.

(21) Appl. No.: 10/135,553

(22) Filed: Apr. 30, 2002

(51) Int. Cl.[7] .................................................. H01K 9/00
(52) U.S. Cl. ...................... 361/816; 361/800; 361/818; 174/51
(58) Field of Search ................................ 361/818, 816, 361/800, 797; 174/51, 35 R (56) References Cited

U.S. PATENT DOCUMENTS

| | | | | |
|---|---|---|---|---|
| 4,503,484 A | * | 3/1985 | Moxon ........................ 361/736 |
| 5,535,099 A | * | 7/1996 | McCarthy et al. .......... 361/800 |
| 6,201,698 B1 | * | 3/2001 | Hunter ........................ 361/704 |
| 6,490,157 B2 | * | 12/2002 | Unrein ........................ 361/687 |

* cited by examiner

Primary Examiner—Randy Gibson
Assistant Examiner—Hung Bui
(74) Attorney, Agent, or Firm—Lisa A. Rode; Mark T. Starr; RatnerPrestia P.C.

(57) ABSTRACT

An apparatus is provided for reducing or eliminating a gap defined between adjacent components of an electronic system, thereby reducing electromagnetic interference generated by the electronic system. The apparatus includes a cam having a cam surface positionable adjacent a component of the electronic system. The cam is moveable to an actuated position in which the cam surface applies a force to the component. The apparatus further includes a support mountable to the electronic system. The support engages the cam and facilitates the movement of the cam. The movement of the cam with respect to the support and into the actuated position causes the cam surface to apply the force to the component, thereby reducing or eliminating a gap between the component and an adjacent component of the electronic system.

14 Claims, 6 Drawing Sheets

ASSEMBLY AND METHOD FOR REDUCING ELECTROMAGNETIC INTERFERENCE GENERATED BY ELECTRONIC SYSTEMS

FIELD OF THE INVENTION

This invention relates to electromagnetic interference caused by an electronic system. More particularly, this invention relates to an apparatus for reducing such electromagnetic interference.

BACKGROUND OF THE INVENTION

Electronic systems are known to generate electromagnetic energy. Such energy generation can, in some instances, cause EMI (Electromagnetic Interference) if in proximity to other electronic systems. It is, therefore, desirable to reduce the amount of electromagnetic interference attributable to such systems.

Electromagnetic energy tends to leak from the interior of electronic systems through gaps defined between adjacent components of such systems. For example, when the outer sheet enclosure or chassis of an electronic system separates from adjacent inner modules such as card holders, electromagnetic leakage may occur. Generally, such separation can form gaps between the chassis and the inner modules. These gaps may result from manufacturing tolerances or deformation of the chassis due to the weight of units stacked in or near it.

Typically, EMI leakage causes transmission problems. Furthermore, electronic systems are required to comply with specific EMS emissions regulations.

Currently, additional fasteners (e.g., screws, clips, rivets, etc.) are installed to secure the chassis to the inner modules in the areas where gaps typically occur. However, such fasteners may be difficult to access if removal of one of the inner modules is required. Furthermore, fasteners may be dropped into the system during removal and cause damage to the system if they come into contact with current-carrying components.

Alternatively, spring fingers or gasket material may be installed to fill the areas where there are gaps. However, this is not always possible due to tight gap clearances. Also, spring finger and gasket materials may relax over time and become less effective.

Finally, these existing solutions (fasteners and filler material, for example) described heretofore may be difficult to apply to operating electronic systems in the field that develop EMI leakage problems.

Accordingly, there remains a need for reducing or eliminating gaps between adjacent components of an electronic system, thereby reducing electromagnetic interference generated by the electronic system.

SUMMARY OF THE INVENTION

According to one aspect of this invention, an apparatus is provided for reducing or eliminating a gap defined between adjacent components of an electronic system, thereby reducing electromagnetic interference generated by the electronic system. The apparatus includes a cam having a cam surface positionable adjacent a component of the electronic system. The cam is moveable to an actuated position in which the cam surface applies a force to the component. The apparatus further includes a support mountable to the electronic system. The support engages the cam and facilitates the movement of the cam. The movement of the cam with respect to the support and into the actuated position causes the cam surface to apply the force to the component, thereby reducing or eliminating a gap between the component and an adjacent component of the electronic system.

According to another aspect of this invention, an electronic system is provided to reduce electromagnetic interference generated thereby. The electronic system includes adjacent housing components and a frame supporting the housing components. The electronic system further includes a cam having a cam surface positionable adjacent one of the housing components. The cam is moveable to an actuated position in which the cam surface applies a force to the housing component. A support is mounted to the frame. The support engages the cam and facilitates the movement of the cam. The movement of the cam with respect to the support and into the actuated position causes the cam surface to apply the force to the housing component, thereby reducing or eliminating the gap between the adjacent components.

According to yet another aspect of this invention, a method is provided for reducing electromagnetic interference generated by an electronic system having adjacent components having a gap therebetween. The method includes the steps of moving a cam surface to apply a force to one of the adjacent components of the electronic system, and reducing the gap between the adjacent components by virtue of the force applied by the cam surface.

BRIEF DESCRIPTION OF THE DRAWINGS

The invention will be described with reference to the exemplary embodiments illustrated in the figures, of which.

DETAILED DESCRIPTION OF THE INVENTION

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

Generally, referring to FIGS. 1–5, an apparatus 10 is provided for reducing or eliminating a gap 36 defined between adjacent components such as a card rack 42 and a chassis 44 of an electronic system 20, thereby reducing electromagnetic interference generated by the electronic system 20. The apparatus 10 includes a cam 12 having a cam surface 14 positionable adjacent a component such as chassis 44 of the electronic system 20. The cam 12 is moveable to an at actuated position "A" in which the cam surface 14 applies a force to the component 44. The apparatus 10 further includes a support 18 mountable to the electronic system 20. The support 18 engages the cam 12 and facilitates the movement of the cam 12. The movement of the cam 12 with respect to the support 18 and into the actuated position "A" causes the cam surface 14 to apply the force to the component 44, thereby reducing or eliminating a gap 36 between the component 44 and an adjacent component 42 of the electronic system 20.

Another aspect of this invention provides an electronic system 20 to reduce electromagnetic interference generated thereby. The electronic system 20 includes adjacent housing components 42 and 44 and a frame 46 supporting the housing components 42 and 44. The electronic system 20 further includes a cam 12 having a cam surface 14 positionable adjacent one of the housing components 44. The cam 12 is moveable to an actuated position "A" in which the cam surface 14 applies a force to the housing component 44. A support 18 is mounted to the frame 46. The support 18 engages the cam 12 and facilitates the movement of the cam 12. The movement of the cam 12 with respect to the support 18 and into the actuated position "A" causes the cam surface 14 to apply the force to the housing component 44, thereby reducing or eliminating the gap 36 between the adjacent components 42 and 44.

According to yet another aspect of this invention, a method is provided for reducing electromagnetic interference generated by an electronic system 20 having adjacent components 42 and 44 having a gap 36 therebetween. The method includes the steps of moving a cam surface 14 to apply a force to one of the adjacent components 44 of the electronic system 20, and reducing the gap 36 between the adjacent components 42 and 44 by virtue of the force applied by the cam surface 14.

Generally with respect to this invention, an apparatus applies pressure to one or more portions of an electronic system such that it closes gaps between the system components. Referring specifically to FIGS. 1A–1D, the apparatus 10 includes a cam 12 positioned at an end portion of a shaft 16, a support 18, and a hexagonal drive 26. The support 18 is used to position the cam 12 and shaft 16 adjacent a component of the electronic system 20. The hexagonal drive 26 is used to turn the shaft 16 with respect to the support 18, and the shaft 16 itself includes grooves 30 to assist in guiding the rotation of the shaft 16 with respect to the support 18.

The shape of the cam 12 includes a flat portion, referred to as a cam surface 14, for contact with a surface of an electronic system 20 (described subsequently). The support 18 includes mounting flanges 22 with thru holes 24 for mounting the support 18 to a component of the electronic system 20 such as the frame 46. The support 18 also includes groove guides 32 to accommodate the grooves 30 of the shaft 16. The groove guides 32 of the support 18 facilitate rotational movement of the shaft 16 with respect to the support 18, yet prevent axial movement of the shaft 16.

Figure 1A:
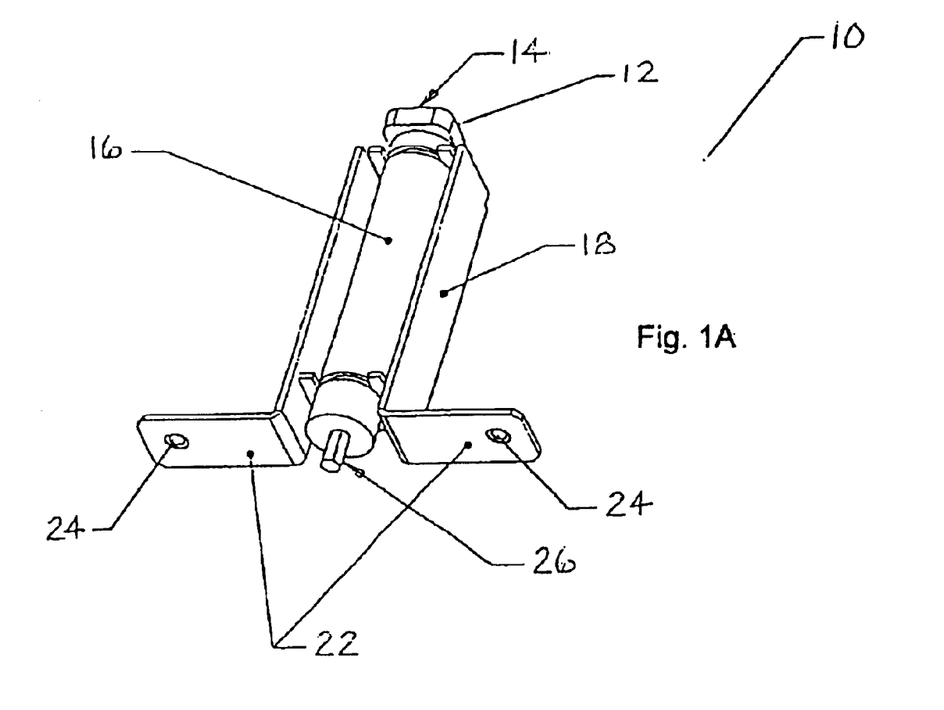
FIG. 1A is a front, perspective view of an embodiment of an apparatus according to aspects of this invention.
Figure 1B:
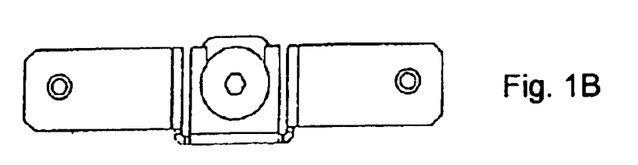
FIG. 1B is a front view of the apparatus illustrated in FIG. 1A.
Figure 1C:
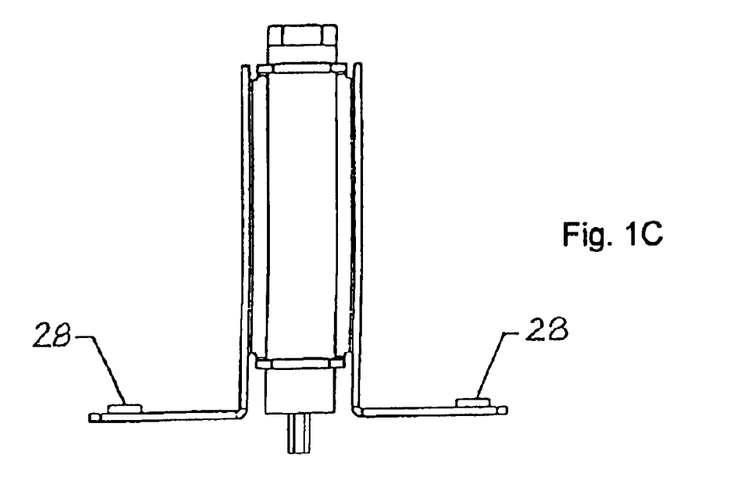
FIG. 1C is a left side view of the apparatus illustrated in FIG. 1A.
Figure 1D:
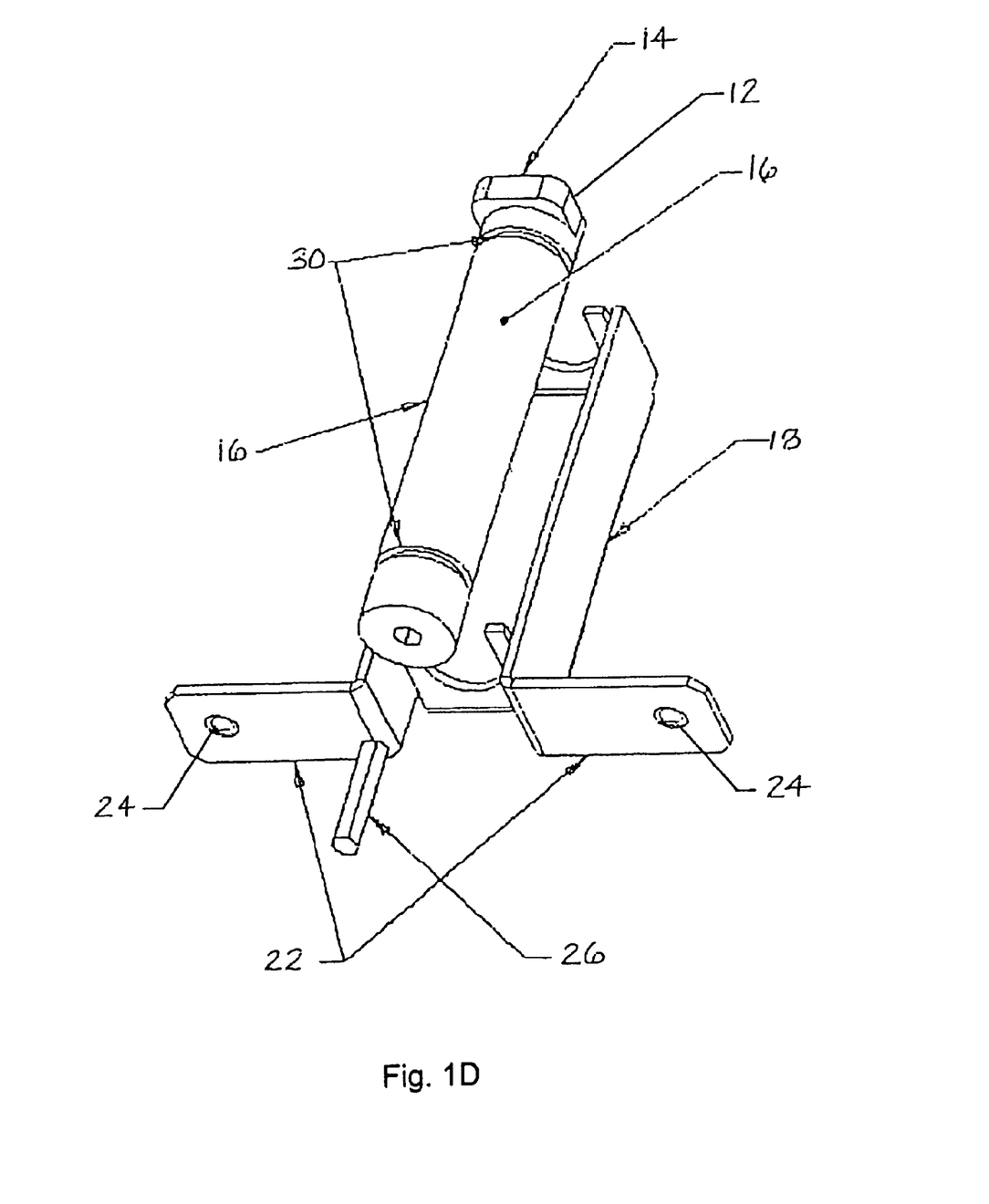
FIG. 1D is an exploded front perspective view of the apparatus illustrated in FIG. 1A.
Figure 2:
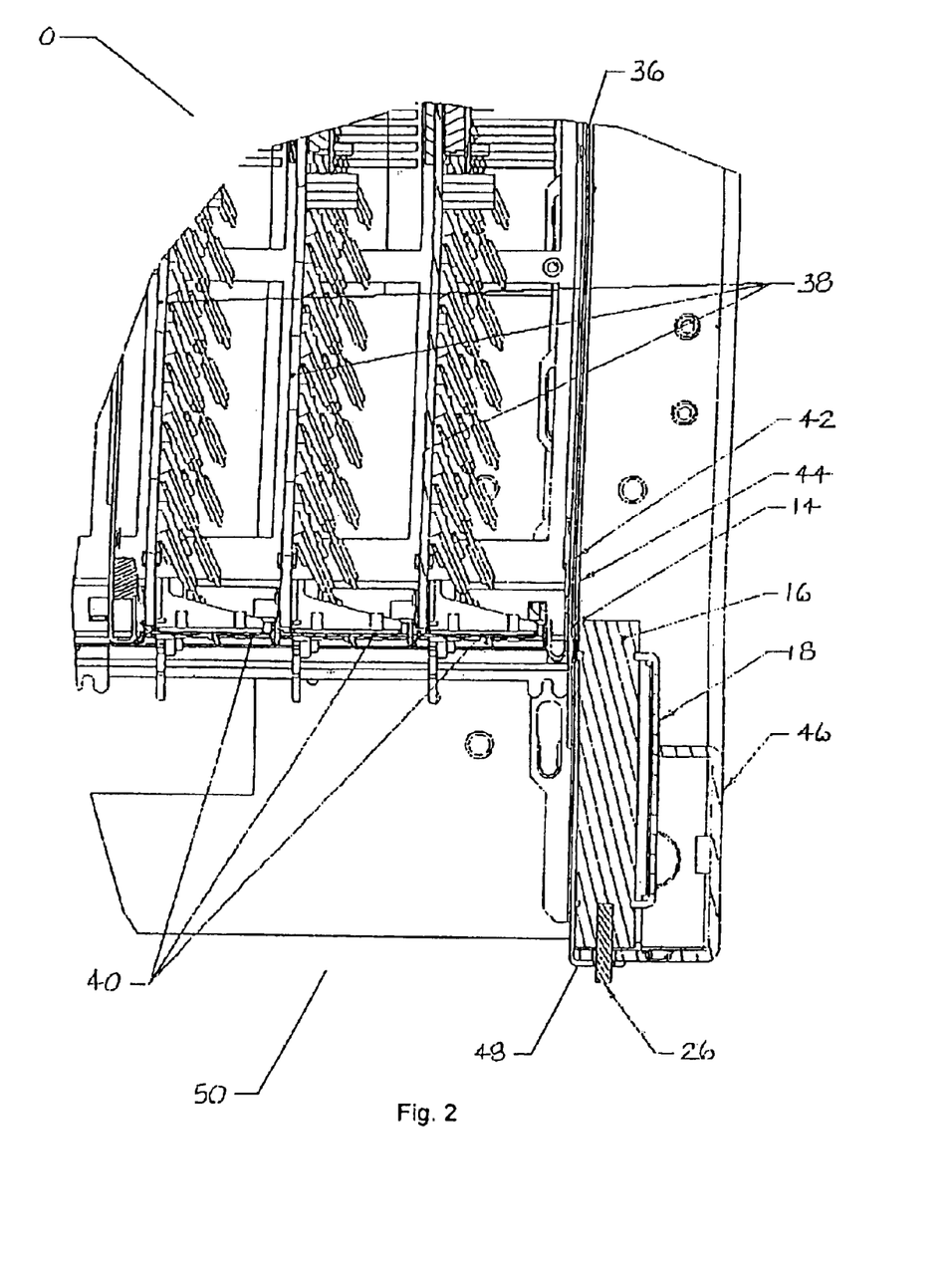
FIG. 2 is a cross-sectional top view of a portion of an embodiment of an electronic system according to aspects of this invention, which includes the apparatus shown in FIG. 1A.

FIG. 2 is a cross-sectional top view illustrating an exemplary embodiment of the apparatus 10 mounted to an electronic system 20 that is supported by a frame 46. An electronic system 20 typically includes printed circuit boards 38 held in place by a card rack 42. The card rack 42 of the electronic system 20 assembly is enclosed by a chassis 44, typically made from sheet metal, with an open portion 50 located at the front of the electronic system 20 for access. Printed circuit card covers 40 face the open front portion 50 of the electronic system 20.

Gaps 36 may exist between the various components of the electronic system 20, namely gaps can form between the chassis 44, the card rack 42, and other components of the system. Such gaps 36 may permit EMI (Electromagnetic Interference) leakage to occur from the system 20, which could, in certain circumstances, cause transmission problems. Furthermore, electronic systems 20 are required to comply with specific EMI emissions regulations.

Figure 3:
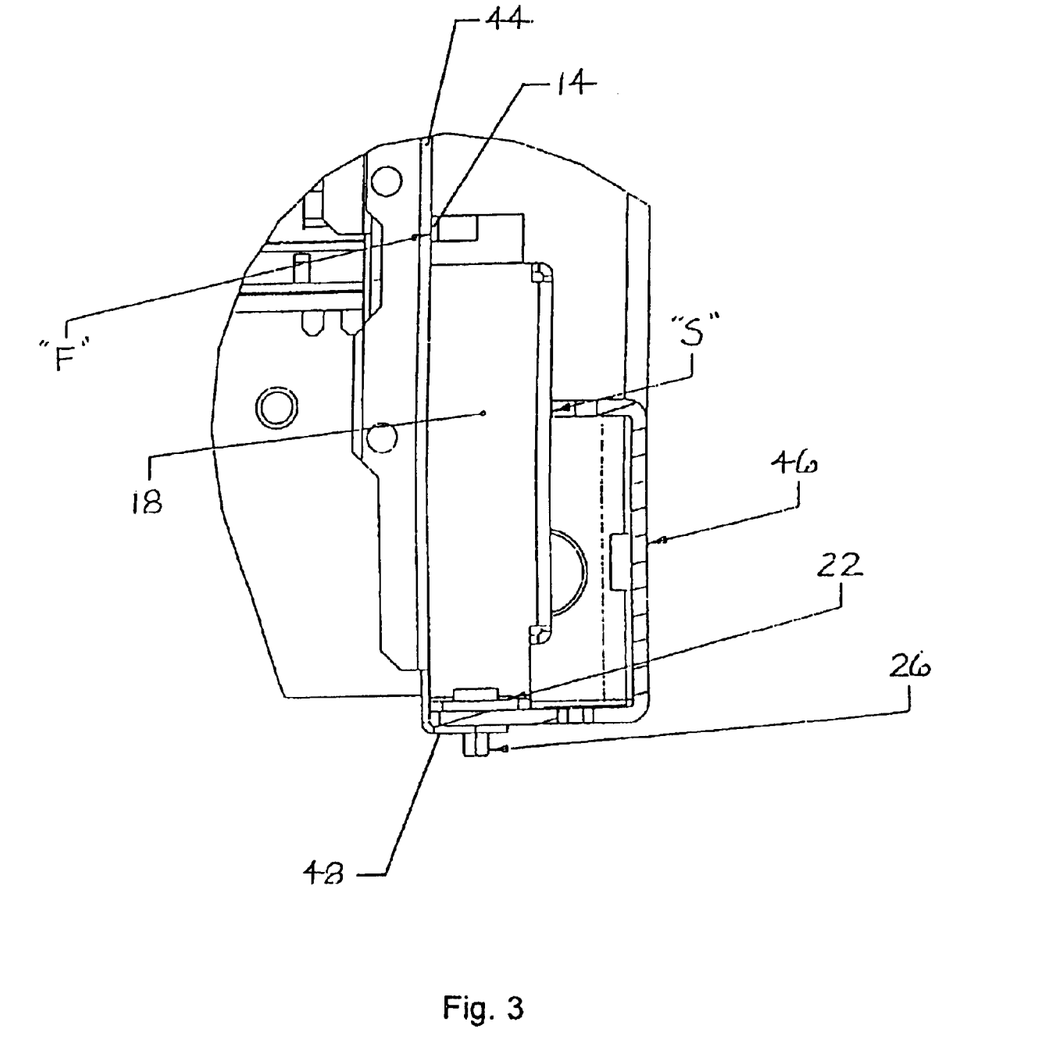
FIG. 3 is a detailed top view of the electronic system illustrated in FIG. 2.

Referring specifically to FIG. 3, which is a detailed top view of the apparatus 10 mounted to the electronic system 20, the chassis 44 includes a chassis flange 48 which defines slots (not shown). The chassis flange 48 slots correspond with standard EIA (Electronic Industry Association) holes (not shown) located along the frame 46. To mount the apparatus 10 on the electronic system 20, the apparatus 10 is slid into the space between the frame 46 and the chassis 44. The cam surface 14 is positioned away from the chassis 44 so that when the apparatus 10 is first mounted, the cam 12 is configured in its relaxed position, as opposed to its actuated position "A" (described subsequently with reference to FIG. 5).

Figure 4:
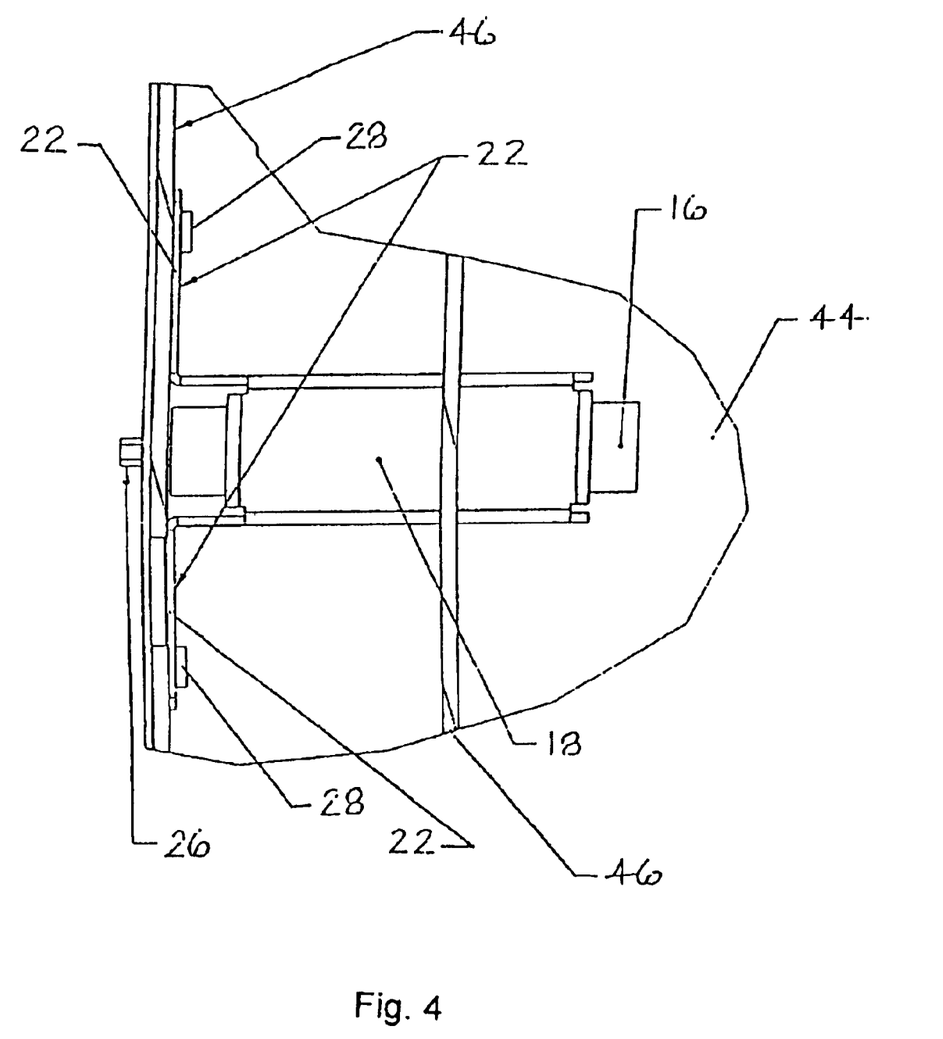
FIG. 4 is a right side view of the electronic system illustrated in FIG. 3.

The thru holes 24 of the mounting flanges 22 of the support 18 are aligned with the corresponding apertures in the frame 46 and the chassis flange 48 (refer also to FIG. 4 for an illustration of the relationships between the support 18, the frame 46, and the chassis flange 48). Fasteners are then inserted from the front, through the chassis flange 48 apertures, through the frame 46 apertures, through the thru holes 24 of the mounting flanges 22 of the support 18, and are threaded into the threaded inserts 28 to secure the apparatus 10 to the electronic system 20. This mounting procedure is accomplished without the removal of the chassis 44 or other components of the electronic system 20.

The hexagonal drive 26 extending from the shaft 16 of apparatus 10 protrudes through an additional set of corresponding apertures in the frame 46 and the chassis flange 48, slightly beyond the chassis flange 48, to permit easy access.

When the hexagonal drive 26 is torqued, the shaft 16 rotates the cam 12 from its relaxed position towards its actuated position "A" (described subsequently with reference to FIG. 5). Referring specifically to FIG. 3, when the cam 12 is rotated toward its actuated position "A," the cam surface 14 pushes against the chassis 44, applying a force to the chassis 44. The point of contact at which the force is applied is denoted as "F." The frame 46 provides rigid support for the cam support 18 when the cam surface 14 engages the chassis 44 and applies a force to the chassis 44. The cam surface 14 applies pressure to the chassis 44 at location "F," which in turn applies pressure to the card rack 42 mounted within the chassis 44. This pressure closes any gaps 36 between the chassis 44 and the card rack 42, eliminating these areas as sources of EMI leakage (see FIG. 2).

FIG. 4, which is a right side view of the apparatus 10 mounted to the electronic system 20, shows the frame 46 cross-sectioned for clarity. FIG. 4 illustrates the relationships between the chassis flange 48, the frame 46, and the mounting flanges 22 as described previously with reference to FIG. 3.

Figure 5:
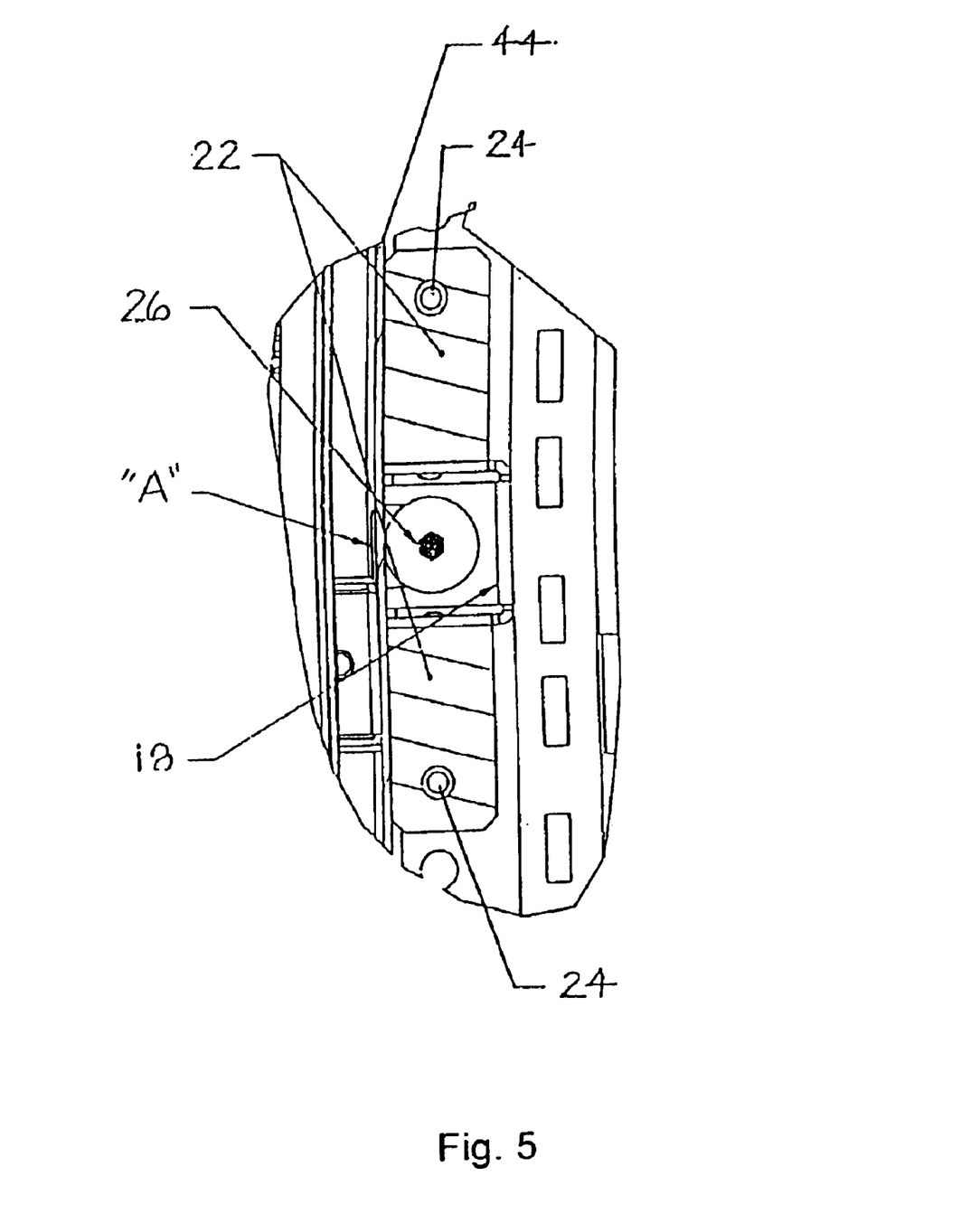
FIG. 5 is a front view of the apparatus illustrated in FIGS. 3 and 4.

FIG. 5 is a front view of the apparatus 10 mounted to the electronic system 20. The frame 46 and chassis flange 48 that the mounting flanges 22 attach to are not shown for clarity. The cam surface 14 is shown in its actuated position "A," protruding through a solid surface of the chassis 44. The purpose of this imaginary view is to represent the relative deflection distance of the chassis 44 when the cam 12 is rotated to its actuated position "A." As described previously, when the hexagonal drive 26 is torqued, the shaft 16 rotates the cam 12 from its relaxed position towards its actuated position "A." The cam surface 14 engages the chassis 44, applying a force to the chassis 44.

In its actuated position "A," the cam surface 14 applies pressure to the chassis 44 at location "F," which applies pressure to the card rack 42. This pressure closes any gaps 36 between the chassis 44, the card rack 42, and perhaps the printed circuit boards 38, eliminating these areas as sources of EMI leakage (see FIG. 2).

When necessary, the cam 12 is easily returned to its relaxed position, by torquing the hexagonal drive 26 in the opposite direction, for the maintenance or removal of the various components of electronic system 20. There are no fasteners required for the operation of this embodiment of the apparatus 10. This feature is a time saver, and also eliminates the possibility of fasteners dropping into the electronic system 20.

A number of apparatuses 10 may be mounted along a surface of an electronic system 20 as necessary to close gaps 36, thereby eliminating such areas as sources of EMI leakage. Also, apparatuses 10 may be installed on opposite sides of an electronic system 20 to apply opposing pressure to close gaps 36.

Although exemplary embodiments of this invention have been described, there are others that support the spirit of the invention and are therefore within the contemplated scope of the invention. Specifically, it will be understood that a wide variety of modifications can be made to the materials, dimensions, proportions, and structures of the components of the apparatus 10 while still enjoying the benefits of this invention.

For example, the cam 12 and shaft 16 are preferably fabricated from nylon to realize low friction rotation and to prevent galling with the groove guides 32. A nylon cam 12 also avoids scraping of the chassis 44. However, various plastics or metals may be utilized. Likewise, the support 18 is preferably fabricated from sheet metal (steel) to provide rigid support (along with the frame 46) during cam 12 actuation. However, various materials of sufficient strength may be utilized. The components of the apparatus 10 are relatively simple and cost effective to fabricate.

Similarly, the size and shape of the cam 12 may be modified to provide varying degrees of chassis 44 deflection, depending upon the size of the gaps 36 that are to be closed. Furthermore, although the cam 12 may be positioned along the depth of the electronic system 20 to correspond to the plane in which the gaps 36 occur, it is not limited to this location. The cam 12 may be positioned anywhere along the length of the shaft 16. Additionally, the cam 12 may extend along the full length of the shaft 16 as opposed to merely the end, in which case the support 18 would have a single groove guide 32. The mating between the shaft 16 and the support 18 is not limited to the groove guides 32 of the support 18 accommodating the grooves 30 of the shaft 16. The support 18 may include grooves which would accommodate circumferential flanges located on the shaft 16.

Furthermore, the shaft 16, the support 18, the mounting flanges 22, and the hexagonal drive 26, may be modified as necessary to accommodate various configurations. For example, a hexagonal drive 26 is not required. Any torquing feature (slot, Phillips, Torx, hexagonal, etc.) would suffice.

The exemplary embodiment of this invention has been described as a kit, i.e., an apparatus 10 (including a cam 12, a shaft 16, and a support 18) that is mounted to an existing electronic system 20 to reduce electromagnetic interference generated by the electronic system 20. Alternatively, the apparatus 10 may be part of the original electronic system 20, either removably mounted or permanently mounted. In other words, the mounting of the apparatus 10 to the electronic system 20 is not limited to the use of fasteners securing the mounting flanges 22 of the support 18 to the frame 46 and the chassis flange 48 as described previously. The apparatus 10 may be mounted in a more permanent fashion, such as by welding the mounting flanges 22 to the frame 46 as part of the original electronic system 20.

It will be appreciated that other modifications can be made to the illustrated embodiments without departing from the scope of the invention, which is separately defined in the appended claims.

What is claimed is:

1. An apparatus adapted to reduce or eliminate a gap defined between adjacent components of an electronic system, thereby reducing electromagnetic interference generated by the electronic system, said apparatus comprising:
   a cam having a cam surface positionable adjacent a component of the electronic system, said cam being moveable to an actuated position in which said cam surface applies a force to the component; and
   a support mountable to the electronic system, said support engaging said cam and facilitating said movement of said cam, said movement of said cam with respect to said support and into said actuated position causing said cam surface to apply the force to the component, thereby reducing or eliminating a gap between the component and an adjacent component of the electronic system.

2. The apparatus recited in claim 1, further comprising means for facilitating movement of said cam with respect to said support.

3. The apparatus recited in claim 1, wherein said support of said apparatus is removeably mountable with respect to the electronic system.

4. The apparatus recited in claim 1, wherein said cam comprises a shaft having an axis, said cam surface facing radially outwardly with respect to said axis of said shaft.

5. The apparatus recited in claim 4, wherein said shaft is engaged by said support for rotational movement.

6. The apparatus recited in claim 1, wherein said cam surface includes a flat surface for contact with the component when said cam surface is moved to said actuated position.

7. The apparatus recited in claim 1, wherein said support includes mounting flanges.

8. The apparatus recited in claim 7, wherein said mounting flanges of said support are secured to the electronic system.

9. The apparatus recited in claim 2, wherein said means for facilitating movement of said cam with respect to said support is a drive shaft.

10. The apparatus recited in claim 9, wherein said drive shaft protrudes from said cam to permit easy access to said drive shaft.

11. The apparatus recited in claim 4, wherein the materials of said shaft and said support are different to prevent galling.

12. The apparatus recited in claim 11, wherein said shaft is made of nylon to facilitate low friction rotation.

13. An electronic system adapted to reduce electromagnetic interference generated thereby, said electronic system comprising:

adjacent housing components;

a frame supporting said housing components;

a cam having a cam surface positionable adjacent one of said housing components, said cam being moveable to an actuated position in which said cam surface applies a force to said housing component; and a support mounted to said frame, said support engaging said cam and facilitating said movement of said cam with respect to said support and into said actuated position, thereby causing the cam surface to apply the force to said housing component, thereby reducing or eliminating any gap between said adjacent components.

14. The electrical system recited in claim 13, wherein said mounting flanges of said support are secured to said electronic systems.

* * * * *